United States Patent [19]
Nitta

[11] Patent Number: 5,627,795
[45] Date of Patent: May 6, 1997

[54] TIMING GENERATING DEVICE

[75] Inventor: Shozo Nitta, Tokyo-To, Japan

[73] Assignee: Kabushiki Kaisha Toshiba, Kawasaki, Japan

[21] Appl. No.: 418,289

[22] Filed: Apr. 7, 1995

[30]   Foreign Application Priority Data

Apr. 8, 1994  [JP]  Japan .................................. 6-070539

[51] Int. Cl.$^6$ ................................................. G11C 8/00
[52] U.S. Cl. ........................... 365/233; 365/194; 327/291
[58] Field of Search ................................. 365/194, 233; 327/291, 295

[56]   References Cited

U.S. PATENT DOCUMENTS 4,379,265  4/1983  Catiller .................................. 327/295

*Primary Examiner*—David C. Nelms
*Assistant Examiner*—F. Niranjan

*Attorney, Agent, or Firm*—Oblon, Spivak, McClelland, Maier & Neustadt, P.C.

[57]   ABSTRACT

The timings can be generated in synchronism with master clocks, so that it is possible to obtain the timing generating device of synchronous circuit, which is effectively applicable to a large scale integrated circuit, while facilitating the test thereof. Addresses A [0, m-1] are given to the register 1 in synchronism with the input pulses CLK; delay data D [0, n-1] are read from the memory device 3 on the basis of the outputs of the register 1; the delayed data are stored in the registers 4-1 to 4-k independently on the basis of the distributive pulses CK1 to CKk applied by the pulse distributing circuit 2 for distributing the input pulse CLK to a plurality of routes in sequence; the data signals S1i to Ski obtained by the registers 4-1 to 4-k are given to the delay circuits 6-1 to 6-k through the DA converters 5-1 to 5-k to control the delay times in such a way that the distributive pulses CK1 to CKk can be controllably delayed by the delay circuits 6-1 to 6-k; and the obtained delay pulses CK1X to CKkX are outputted through the OR gate 7 as a continuous pulse train.

32 Claims, 13 Drawing Sheets

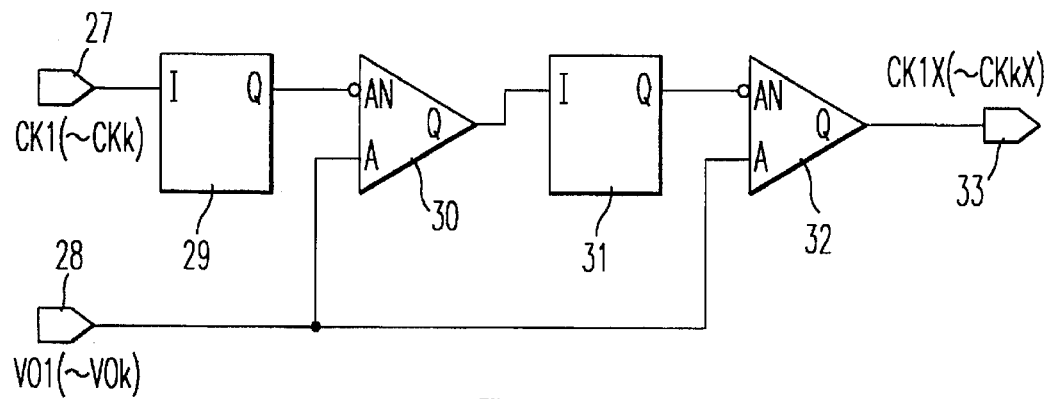
FIG. 7
FIG. 8A  CK1(~CKk)
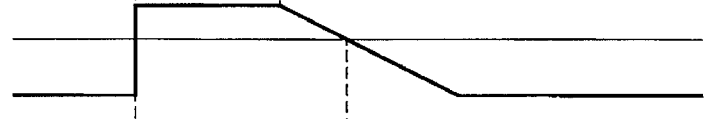
FIG. 8B  VO1(~VOk)
FIG. 8C
FIG. 8D  VO1(~VOk)
FIG. 8E  CK1X(~CKkX)

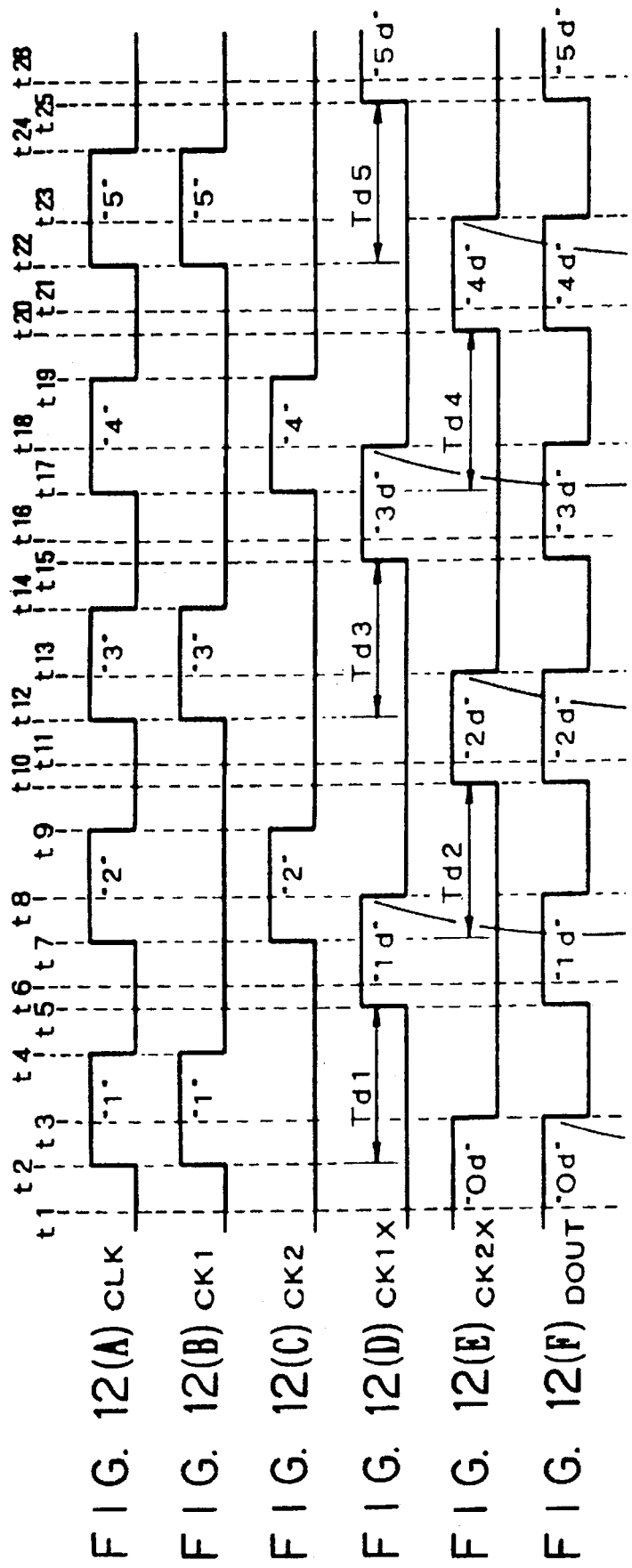

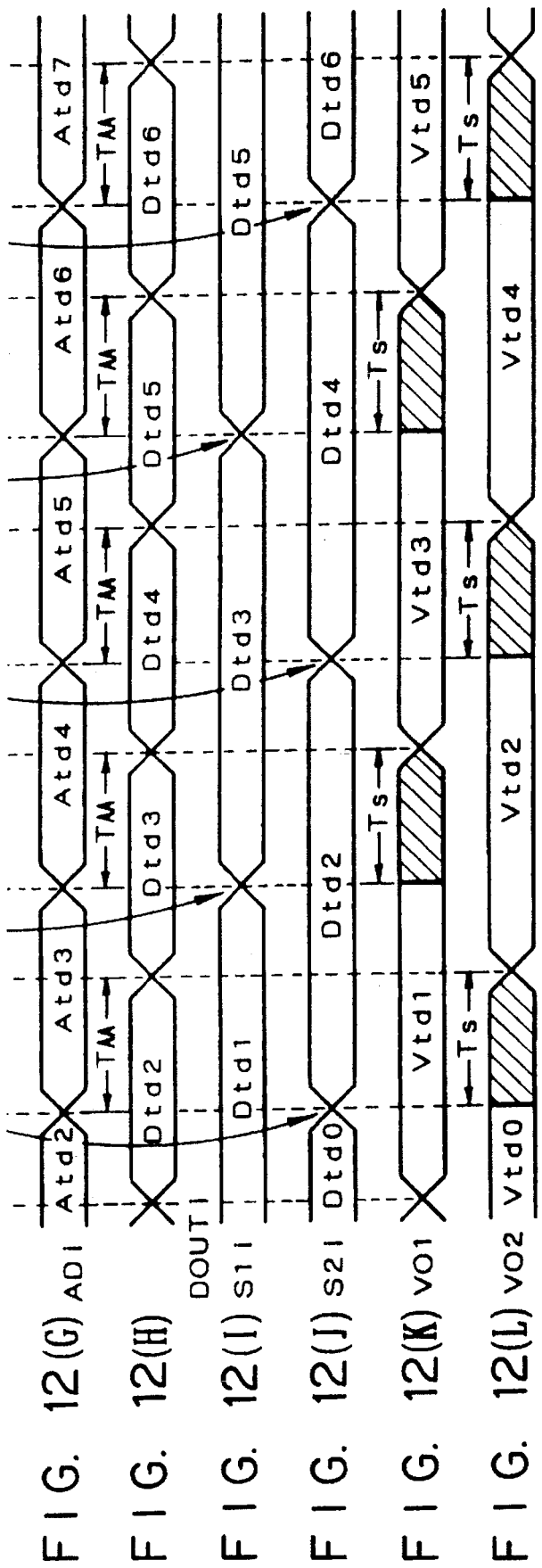

TIMING GENERATING DEVICE

FIELD OF THE INVENTION

The present invention relates to a timing generating device, and more specifically to an improvement of a circuit for generating system clock timings, which is suitable for a high speed digital LSI, in particular.

DESCRIPTION OF THE RELATED ART

FIG. 11 shows an example of related (not prior art) timing generating device invented by the same inventors and already filed as a prior application (now pending).

In FIG. 11, a pulse signal CLK inputted through a clock input terminal 9 is given to a clock input terminal CK of a D-type flip-flop 11. In the D-type flip-flop 11, since a /Q output is feedbacked to a D input, the states of the Q output and the /Q output are both inverted in response to the input pulse CLK. Here, the /Q output signal is an inversion signal of the Q output signal.

The Q output of the flip-flop 11 is inputted to an AND gate 13 together with the input pulse CLK, and the /Q output of the flip-flop 11 is inputted to an AND gate 12 together with the input pulse CLK.

Further, the AND gate 12 outputs a distributive pulse CK1, which is given to a variable delay circuit 6-1. Further, the AND gate 13 outputs a distributive pulse CK2, which is given to a variable delay circuit 6-2. Here, the delay circuit 6-1 delays the distributive pulse CK1 according to the level of the signal V01, and outputs it as a delayed pulse CK1X. Further, the delay circuit 6-2 delays the distributive pulse CK2 according to the level of the signal V02, and outputs it as a delayed pulse CK2X.

The delayed pulse CK1X of the delay circuit 6-1 and the delayed pulse CK2X of the delay circuit 6-2 are both inputted to an OR gate 7, and outputted as a pulse output DOUT through an output terminal 10.

Further, the signal V01 is given from a DA converter 5-1 to the delay circuit 6-1; and the signal V02 is given from a DA converter 5-2 to the delay circuit 6-2.

On the other hand, an address data input Ai is inputted through an address input terminal 8, and then given to a D-type register 1. To a CK input of this register 1, an output of the OR gate 7 is given, so that the address data input Ai can be applied to the register 1 in synchronism with the output signal of the OR gate 7. Further, an address data ADi latched by the register 1 is given to a memory device 3.

On the other hand, data corresponding to the address data ADi is outputted from a pulse output DOUTi of the memory device 3, and then given to two D inputs of registers 38-1 and 38-2, respectively.

The delayed pulse CK1X is given to a CK input of the register 38-1, and data of a Q output thereof is given to the DA converter 5-1 as a data signal S1i. On the other hand, the delayed pulse CK2X is given to a CK input of the register 38-2, and data of a Q output thereof is given to the DA converter 5-2 as a data signal S2i.

Further, the numbers of the address input terminals 8, the registers 1 and the registers 38-1 and 38-2 are determined according to the number of digits of the address data input Ai and the number of digits of the data outputted from the pulse output DOUTi of the memory device 3.

The construction of the circuit constructed as described above will be explained with reference to a timing chart shown in FIG. 12, in which (A) denotes the input pulse CLK inputted through the clock input terminal 9; (B) denotes the distributive pulse CK1 (the output signal of the AND gate 12); (C) denotes the distributive pulse CK2 (the output signal of the AND gate 13); (D) denotes the delay pulse CK1X (the output of the delay circuit 6-1); (E) denotes the delay pulse CK2X (the output of the delay circuit 6-2); (F) denotes the pulse output DOUT outputted through the output terminal 10; (G) denotes the address data ADi inputted through the address input terminal 8 and then latched by the register 1; (H) denotes the data signal outputted from the pulse output DOUTi of the memory device 3; (I) denotes the data signal S1i given from the register 38-1 to the DA converter 5-1; (J) denotes the data signal S2i given from the register 38-2 to the DA converter 5-2; (K) denotes the level of the signal V01 given from the DA converter 5-1 to the delay circuit 6-1; and (L) denotes the level of the signal V02 given from the DA converter 5-2 to the delay circuit 6-2, respectively.

In the construction shown in FIG. 11, the flip-flop 11 and the AND gates 12 and 13 realize a pulse distributing function. The input pulse CLK inputted through the clock input terminal 9 rises to a high level at time t2, falls to a low level at time t4, rises to the high level again at time t7 and falls to the low level again at time t9, repeating the similar operation. As a result, a serial pulse train can be inputted to the CK input of the flip-flop 11 in sequence as the high-level pulse "1" between time t2 and time t4, the high-level pulse "2" between time t7 and time t9, the high-level pulse "3" between time t12 and time t14, the high-level pulse "4" between time t17 and time t19, the high-level pulse "5" between time t22 and time t24 and so on.

The flip-flop 11 repeats such an operation that the signal levels are reversed whenever the pulse applied to the CK input thereof falls. In the example shown in FIG. 12, the Q output level changes to the high level, and the /Q output level changes to the low level when the pulse "1" falls. Therefore, the Q output level changes to the low level, and the /Q output level changes to the high level when the pulse "2" falls. The similar operation as above is repeated whenever the pulse train falls.

As a result, the AND gate 12 to which the /Q output of the flip-flop 11 and the input pulse CLK are given selects the pulses "1", "3" and "5" as shown in FIG. 12(B) and applies the selected pulses to the delay circuit 6-1 as the distributive pulses CK1. Further, the AND gate 13 to which the Q output of the flip-flop 11 and the input pulse CLK are given selects the pulses "2", "4" and "6" as shown in FIG. 12(C) and applies the selected pulses to the delay circuit 6-2 as the distributive pulses CK2.

As shown in FIG. 12(D), the delay circuit 6-1 delays the distributive pulse CK1 by a delay time corresponding to the level of the signal V01, and outputs it as a delayed pulse CK1X. Further, as shown in FIG. 12(E), the delay circuit 6-2 delays the distributive pulse CK2 by a delay time corresponding to the level of the signal V02, and outputs it as a delayed pulse CK2X.

Further, since both the signals V01 and V02 change during the on-the-fly operation, the delay time changes according thereto.

Here, as shown in FIG. 12(D) and (E), on the basis of the control of the signals V01 and V02, the pulse "1" is delayed to the pulse "1d" by a delay time Td1; the pulse "2" is delayed to the pulse "2d" by a delay time Td2; the pulse "3" is delayed to the pulse "3d" by a delay time Td3; the pulse "4" is delayed to the pulse "4d" by a delay time Td4; and the pulse "5" is delayed to the pulse "5d" by a delay time Td5.

As a result, the pulse "1d" rises at time t5 and falls at time t8; the pulse "2d" rises at time t10 and falls at time t13; the pulse "3d" rises at time t15 and falls at time t18; the pulse "4d" rises at time t20 and falls at time t23; and the pulse "5d" rises at time t25.

The two delayed pulses CK1X and CK2X are synthesized by the OR gate 7, being returned to a continuous pulse, and then outputted as the pulse output DOUT through the output terminal 10, as shown in FIG. 12(F).

Further, the output signal of the OR gate 7 is given to the CK input of the register 1 as a clock. As a result, the register 1 latches the address data Ai inputted through the address input terminal 8 in synchronism with the fall edge of the pulse output DOUT of the delayed pulse train, and then outputs the latched data as the address data ADi from the Q output thereof. As a result, as shown in FIG. 12(G), the address data ADi of the memory device 3 changes from the address Atd2 to Atd3 at time t3; from the address Atd3 to Atd4 at time t8; from the address Atd4 to Atd5 at time t13; from the address Atd5 to Atd6 at time t18; and from the address Atd6 to Atd7 at time t23.

A predetermined constant address access time TAA after the address data ADi has been decided, the memory device 3 changes the level of the pulse output DOUTi. As a result, as shown in FIG. 12(H), the level of time pulse output DOUTi changes from Dtd2 to Dtd3 at time t6 (at which the memory access time TAA has elapsed after time t3); from Dtd3 to Dtd4 at time t11 (at which the memory access time TAA has elapsed after time t8); from Dtd4 to Dtd5 at time t16 (at which the memory access time TAA has elapsed after time t13); from Dtd5 to Dtd6 at time t21 (at which the memory access time TAA has elapsed after time t18); and from Dtd6 to the succeeding level at time t26 (at which the memory access time TAA has elapsed after time t23). Further, since the similar operation has been made before the operation as described above, the level of the pulse output DOUTi changed from Dtd1 to Ded2 at time t1.

The register 38-1 latches the output level of the memory device 3 on the basis of the delay pulse CK1X, and outputs the latched data to the DA converter 5-1 as the data signal S1i. As a result, as shown in FIG. 12(I), the Q output (i.e., data signal S1i) of the register 38-1 is given to the DA converter 5-1 as follows: Dtd1 is outputted until t8 at which the pulse "1d" falls; Dtd3 is outputted between time t8 and the time 18 at which the pulse "3d" falls; and Dtd5 is outputted after time t18.

On the other hand, the register 38-2 latches the output level of the memory device 3 on the basis of the delay pulse CK2X, and outputs the latched data to the DA converter 5-2 as the data signal S2i. As a result, as shown in FIG. 12(J), the Q output (i.e., data signal S2i) of the register 38-2 is given to the DA converter 5-2 as follows: Dtd0 is outputted until t3 at which the pulse "0d" falls; Dtd2 is outputted between time t3 and the time at which the pulse "2d" falls; Dtd4 is outputted between time t13 and time t23 at which the pulse "4d" falls; and Dtd6 is outputted after time t23.

Further, in both the DA converters 5-1 and 5-2, a settling time Ts is necessary between after the data signals S1i and S2i have been decided and till the respective output signals V01 and V02 are decided.

Therefore, as shown in FIG. 12(K), singe the voltage level of the signal V01 given from the DA converter 5-1 to the delay circuit 6-1 to determine the delay time is decided after the settling time Ts has elapsed after the data signal S1i inputted to the DA converter 5-1 was decided, it is necessary to neglect the voltage during the settling time. As a result, the delay circuit 6-1 is operated on the basis of the delay time based upon the signal Vtd1 between the times t1 and t8; on the basis of an indefinite delay time between time t8 (at which the data signal S1i changes from Dtd1 to Dtd3) and time t11 (at which the settling time Ts has elapsed); on the basis of the delay time based upon the signal Vtd3 between the times t11 and t18; on the basis of an indefinite delay time between time t18 (at which the data signal S1i changes from Dtd3 to Dtd3) and time t21 (at which the settling time Ts has elapsed); and after that on the basis of the delay time based upon the signal Vtd3.

On the other hand, as shown in FIG. 12(L), since the voltage level of the signal V02 given from the DA converter 5-2 to the delay circuit 6-2 to determine the delay time is decided after the settling time Ts has elapsed after the data signal S2i inputted to the DA converter 5-2 was decided, it is necessary to neglect the voltage during the settling time. As a result, the delay circuit 6-2 is operated on the basis of the delay time based upon the signal Vtd0 until the time t3 (at which the data signal S2i changes from Dtd0 to Dtd2); on the basis of an indefinite delay time between time t3 (at which the data signal S2i changes from Dtd0 to Dtd2) and time t6 (at which the settling time Ts has elapsed); on the basis of the delay time based upon the signal Vtd2 between the times t6 and t13; on the basis of an indefinite delay time between time t13 (at which the data signal S2i changes from Dtd2 to Dtd4 and time t16 (at which the settling time Ts has elapsed); after that on the basis of the delay time based upon the signal Vtd4 between times t16 and t23; and on the basis of an indefinite delay time between time t23 (at which the data signal S2i changes from Dtd4 to Dtd6) and time t26 (at which the settling time Ts has elapsed).

Accordingly, in the delay circuit 6-1, since the delay time Td1 (corresponding to when the signal V01 is Vtd1 from the timing standpoint) is applied to the pulse "1", the pulse "1d" delayed by a delay time Td1 from the pulse "1" can be obtained; since the delay time Td3 (corresponding to when the signal V01 is Vtd3 from the timing standpoint) is applied to the pulse "3", the pulse "3d" delayed by a delay time Td3 from the pulse "3" can be obtained and since the delay time Td5 (corresponding to when the signal V01 is Vtd5 from the timing standpoint) is applied to the pulse "5", the pulse "3d" delayed by a delay time Td5 from the pulse "5" can be obtained.

On the other hand, in the delay circuit 6-2, since the delay time Td2 (corresponding to when the signal V02 is Vtd2 from the timing standpoint) is applied to the pulse "2", the pulse "2d" delayed by a delay time Td2 from the pulse "2" can be obtained; and since the delay time Td4 (corresponding to when the signal V02 is Vtd4 from the timing standpoint) is applied to the pulse "4", the pulse "4d" delayed by a delay time Td4 from the pulse "4" can be obtained.

As a result, the pulse train obtained as the pulse output DOUT through the output terminal 10 in response to the pulse train given as the input pulse CLK through the clock input terminal 9 is as follows: the pulse "1" becomes the pulse "1d" delayed by the delay time Td1 therefrom; the pulse "2" becomes the pulse "2d" delayed by the delay time Td2 therefrom; the pulse "3" becomes the pulse "3d" delayed by the delay time Td3 therefrom; the pulse "4" becomes the pulse "4d" delayed by the delay time Td4 therefrom; and the pulse "5" becomes the pulse "5d" delayed by the delay time Td5 therefrom.

In other words, it is possible to delay each pulse by the delay time corresponding to the address data input Ai given through the address input terminal 8.

As described above, it is possible to provide a wide variable delay range by distributing the input pulse CLK (the pulse train) inputted through the clock input terminal 9 into a plurality of pulses, by delaying the distributive pulses independently, and by synthesizing them thereafter. In addition, if the delay rate is changed largely as with the case of the on-the-fly operation, since a plurality of distributive pulses can be used, it is possible to apply this method to a high speed pulse train.

In the above-mentioned timing generating device, however, since the address data input Ai inputted through the address input terminal 8 are transferred to the register 1 at the timing determined by the outpost of the OR gate 7, that is, by the pulses passed through the delay circuits 6-1 and 6-2, as described above, there exists a problem in that the transmission timings of the address data input Ai disperse according to the delay rates of the delay circuits 6-1 and 6-2. In other words, the asynchronous circuit as described above cannot be applied to the present large scale integrated circuits of synchronous system, so that there exists a difficulty from the standpoint of test simplification.

SUMMARY OF THE INVENTION

With these problems in mind, therefore, it is the object of the present invention to provide a timing generating device for generating timings in synchronism with a master clock, which can realize a synchronous circuit effectively applicable to the current large scale integrated circuits, while facilitating tests.

To achieve the above-mentioned object, the present invention provides a timing generating device, comprising: pulse distributing means for distributing a clock pulse signal to a plurality of routes in sequence and outputting the distributed pulses; first register means for reading address data in synchronism with the clock signal; storing means for reading output of said first register means as address data and outputting delay time data; a plurality of second register means for reading and storing the outputted data of said storing means individually on the basis of the distributed pulses; a plurality of delaying means for controllably delaying the distributed pulses individually on the basis of the output data of said second register means; and output means for outputting the delayed distributed pulses.

Further, the present invention provides a timing generating device, comprising: pulse distributing means for distributing a clock pulse signal to a plurality of routes in sequence and outputting the distributed pulses; a plurality of delaying means for receiving corresponding one of the distributed pulses, respectively and for delaying each of the received distributed pulses individually; and delay time data applying means for reading each of delay time data in synchronism with the clock signal and for applying each read delay time data to corresponding one of a plurality of said delaying means.

In the timing generating circuit according to the present invention, delay time data corresponding to the address are read from memory means on the basis of the output of the first register means operative in synchronism with the clock signal; the read delay time data are held by a plurality of second register means arranged in correspondence to the addresses of the basis of the distributive pulses applied by the pulse distributing means; a plurality of delaying means are controlled on the basis of the output data of the second register means; the distributive pulses are delayed controllably and independently; and the obtained delay pulses are outputted through the outputting means.

Further, in the above-mentioned means of the timing generating device according to the present invention, the clock pulse signal is distributed into a plurality of routes through the pulse distributing means; and the distributive pulses are applied to the delaying means, respectively. Here, since the delay time data obtained in synchronism with the clock signal are applied to the delaying means, the respective distributive pulses are delayed according to the respective delay time data, respectively.

BRIEF DESCRIPTION OF THE DRAWINGS

FIG. 7 is a circuit diagram showing a first example of the delay circuit shown in FIG. 1;

FIG. 8 is a timing chart for assistance in explaining the operation of the circuit shown in FIG. 7;

FIG. 12 is a timing chart for assistance in explaining the operation of the device shown in FIG. 11.

DETAILED DESCRIPTION OF THE EMBODIMENTS

Figure 1A:
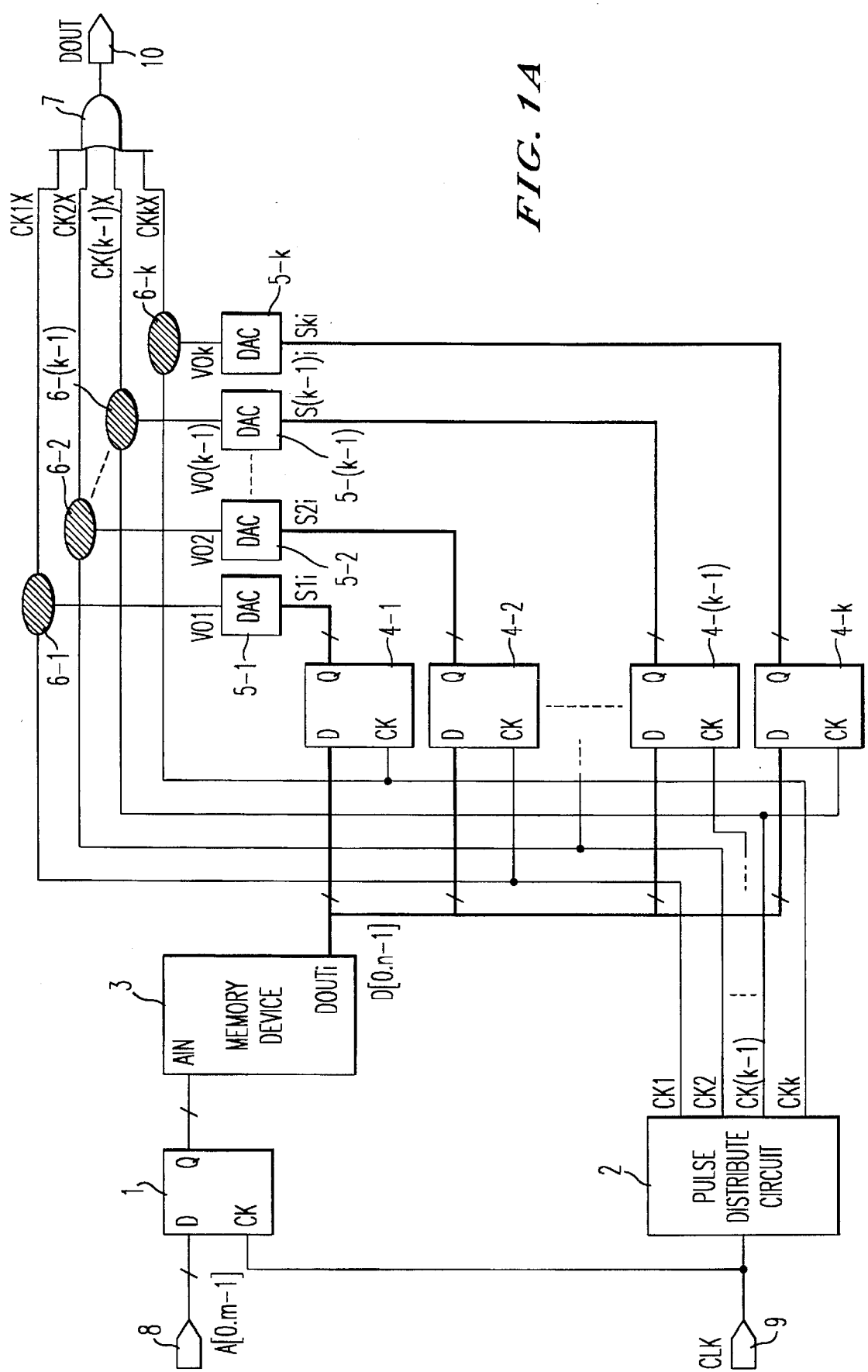
FIGS. 1, 1A and 1B are circuit diagrams showing different embodiments of the timing generating device according to the present invention.
Figure 1B:
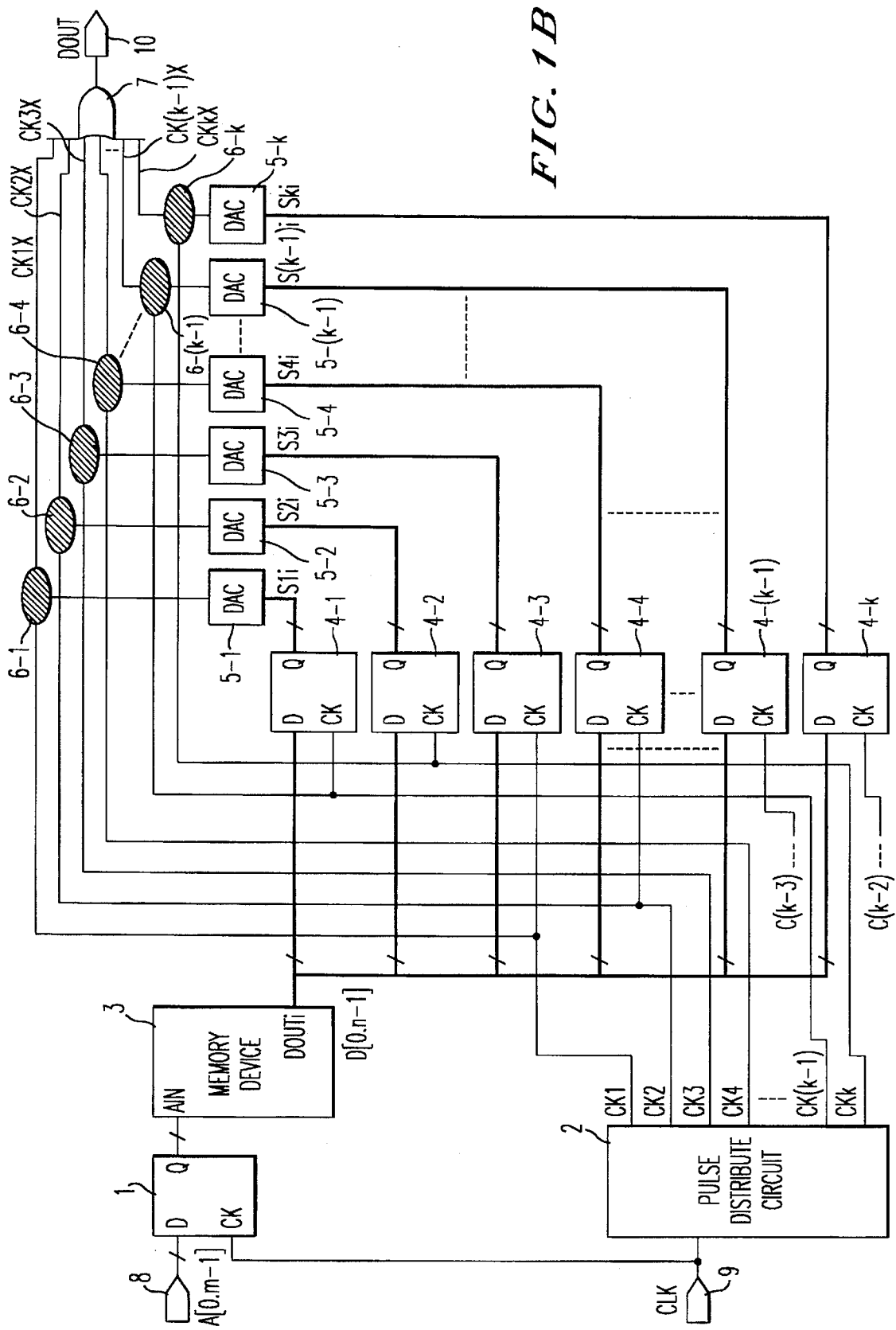
Figure 1C:
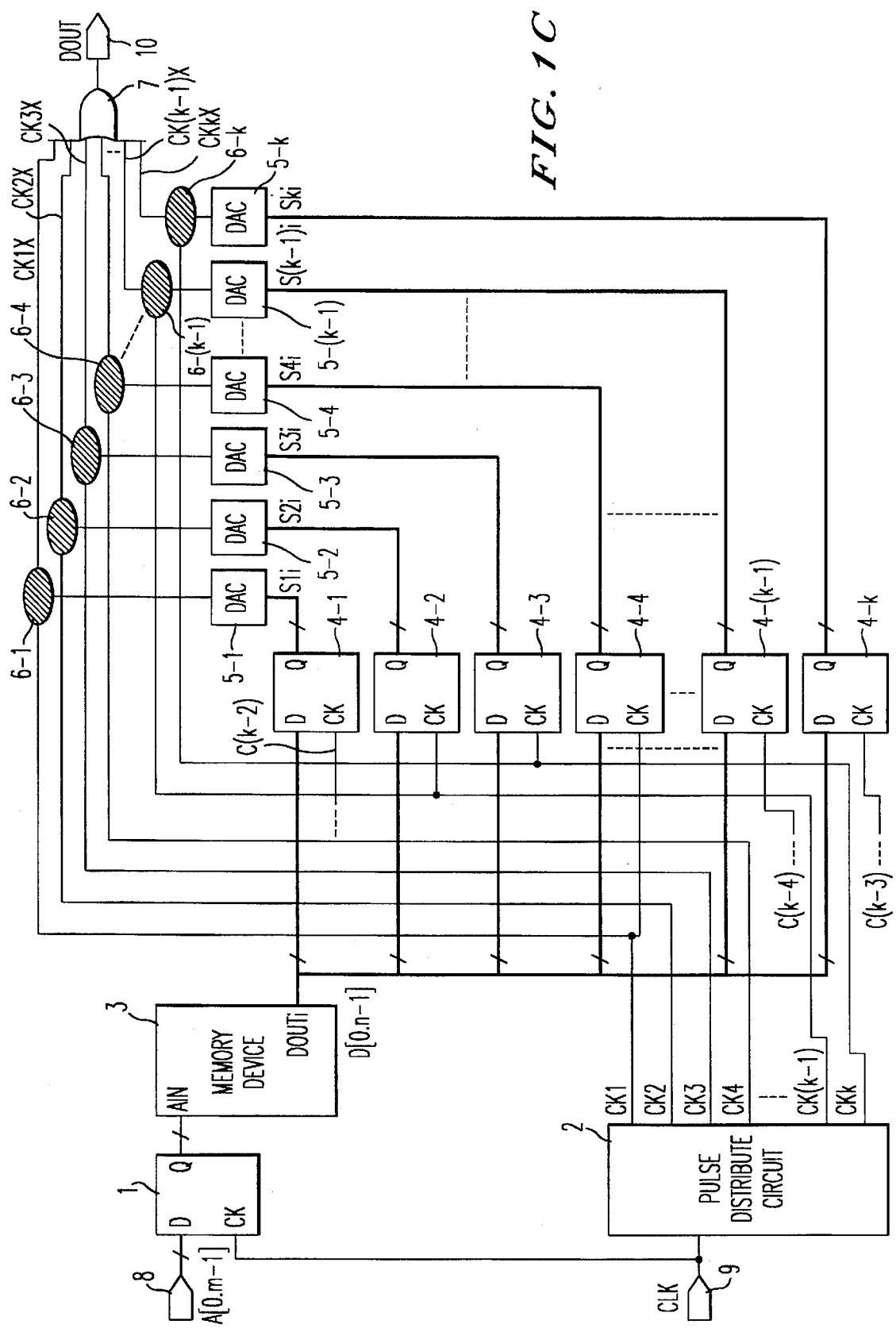

FIG. 1 is a block diagram showing an embodiment of the timing generating device according to the present invention. In the drawing, addresses A [0, m-1] inputted through an address input terminal 8 are given to a D input of a register 1. An input pulse CLK inputted through a clock input terminal 9 is applied to a CK input of the register 1. Further, data D [0, n-1] are outputted from a data output DOUTi of a memory device 3.

On the other hand, the input pulse CLK inputted through the clock input terminal 9 is distributed by a pulse distributing circuit 2, and outputted as k-units of distributive pulses CK1 to CKk. These distributive pulses CK1 to CKk are inputted to delay circuits 6-1 to 6-k, respectively.

The data D [0, n-1] outputted by the memory device 3 are given to a D input of k-units of registers 4-1 to 4-k. To CK inputs of these registers 4-1 to 4-k, the distributive pulses CK1 to CKk of the pulse distributing circuit 2 are given, respectively. Further, from Q outputs of the registers 4-1 to 4-k, data signals S1i to Ski are outputted, and then given to DA converters 5-1 to 5-k, respectively.

The DA converters 5-1 to 5-k convert the data signals S1i to Ski into analog signals, respectively, and then apply the converted analog signals to the delay circuits 6-1 to 6-k as control signals, respectively.

The delay circuits 6-1 to 6-k delay the distributive pulse CK1 to CKk given by the pulse distributing circuit 2 by delay times determined on the basis of signals V01 to V0k, respectively, and output these delayed signals as delayed pulses CK1X to CKkX, respectively.

These delayed pulses CK1X to CKkX are given to an OR gate 7 to obtain a logical sum, and the synthesized logical sum is outputted through the output terminal 10 as a pulse output DOUT.

Figure 10:
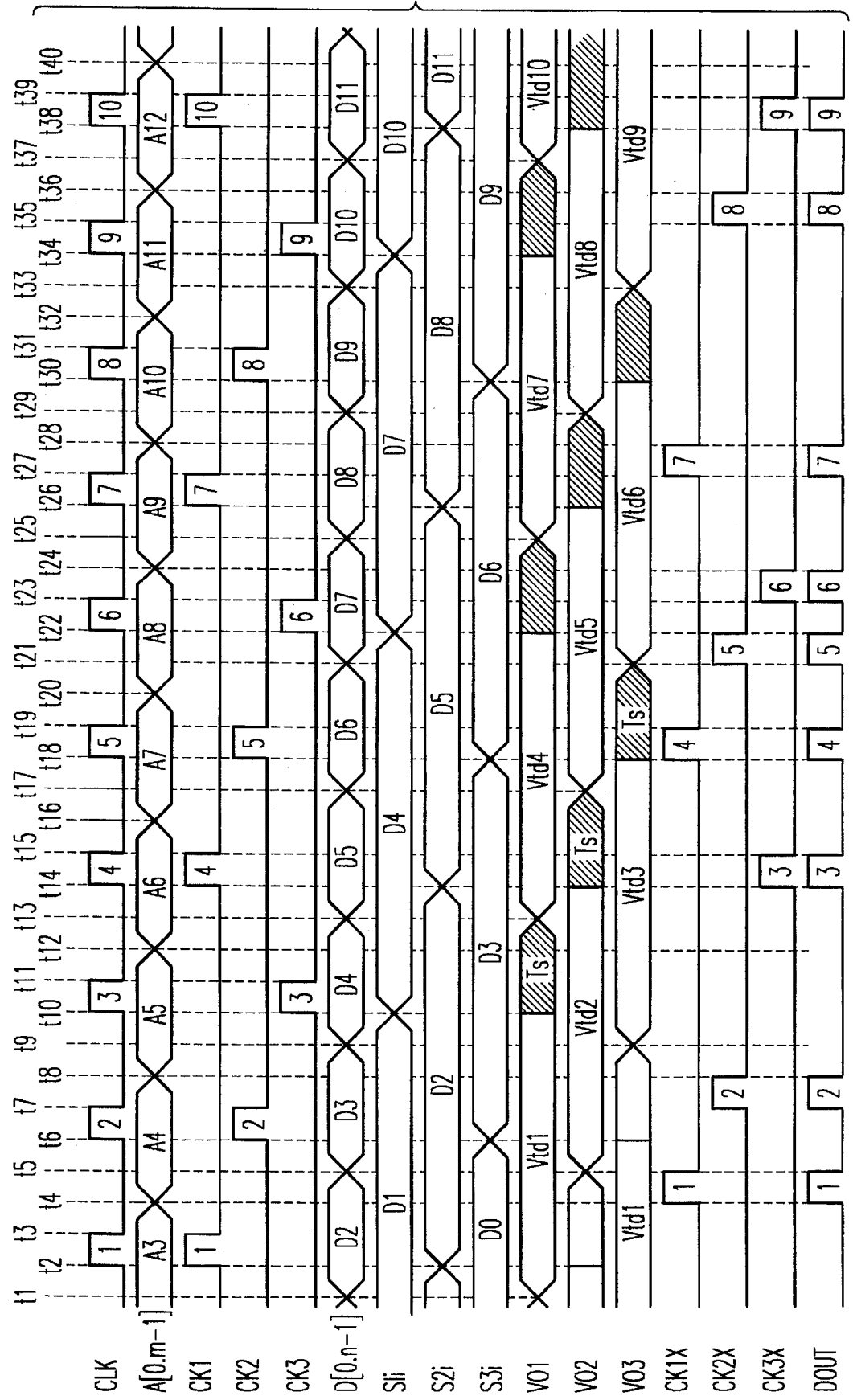
FIG. 10 is a timing chart for assistance in explaining the operation of the device shown in FIG. 1.
Figure 11:
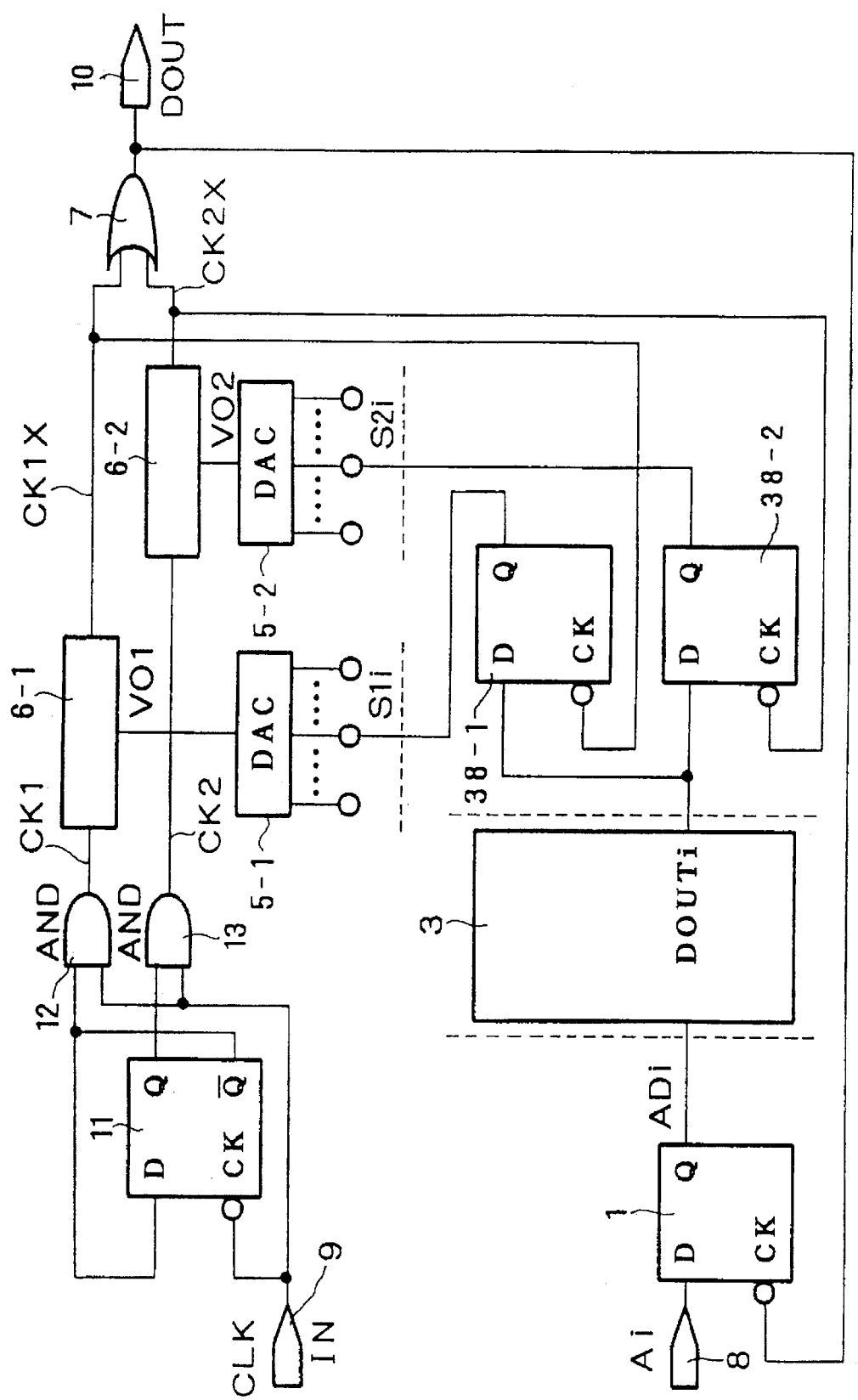
FIG. 11 is a timing generating circuit (not a prior art) related to the present invention.

In the construction as described above, the operation thereof will be described hereinbelow with reference to a timing chart shown in FIG. 10, in which k is assumed to be "3". In FIG. 10, (A) denotes the input pulse CLK inputted through the input terminal 9; (B) denotes the addresses A [0, m-1] inputted through the address input terminal 8; (C),(D) and (E) denote the distributive pulses CK1, CK2 and CK3 outputted by the pulse distributing circuit 2, respectively; (F) denotes the data D [0, n-1] outputted by the memory device; (G), (H) and (I) denote the data signals S1i, S2i and S3i outputted by the resisters 4-1, 4-2 and 4-3, respectively; (J), (K) and (L) denote the level decision timings of the signals V01, V02 and V03 outputted by the DA converters 5-1, 5-2 and 5-3, respectively; (M), (N) and (0) denote the delay pulses CK1X, CK2X and CK3X outputted by the delay circuits 6-1, 6-2 and 6-3, respectively; and (P) denotes the pulse output DOUT outputted through the output terminal 10.

Here, the input pulse CLK inputted through the clock input terminal 9 is assumed to be "1", "2", "3", . . .

On the other hand, the m-bit addresses A [0, m-1] inputted through the address input terminal 8 to the register 1 in synchronism with the input pulse CLK are assumed to be A1, A2, A3 . . . , in sequence. The address An is given to the memory device 3 through the register 3. In response to the given address An, the memory device 3 stores the delayed data Dn corresponding to the input pulses CLK "1", "2", "3", . . . , respectively. Here, in the case of the timing chart shown in FIG. 10, the address data An+2 corresponds to the input pulse CLK "n" in synchronism therewith.

In synchronism with the respective rise edges of the respective input pulses CLK "n" at times t2, t6, t10, t14, t18, t22, t26, t30, t34 and t38, the addresses An+2 are read in the register 1. After the memory access time TAA of the memory device 3 has elapsed; that is, at time t5, t9, t13, t17, t21, t25, t29, t33, t37, data Dn+2 are read from the data output DOUTi of the memory device 3 to data lines.

On the other hand, the respective pulses "n" of the input pulse CLK are distributed by the pulse distributing circuit 2 as follows: into the distributive pulse CK1 if the remainder is "1" in "n/3"; into the distributive pulse CK2 if the remainder is "2" in "n/3"; and into the distributive pulse CK3 if the remainder is "0" in "n/3.

The distributive pulse CK1 is given to the CK input of the register 4-2; the distributive pulse CK2 is given to the CK input of the register 4-3; and the distributive pulse CK3 is given to the CK input of the register 4-1, respectively. Therefore, at the respective rise edge timings of these pulses, the registers 4-1, 4-2 and 4-3 read data Dn+1 from the memory device 3.

Therefore, the register 4-1 reads data D4, D7 and D10 at time t10, t22 and t34 on the basis of the distributive pulse CK3, and the read data D4, D7 and D10 are outputted to the Q output in sequence as the data signals S1i.

On the other hand, the register 4-2 reads data D2, D5, D8 and D11 at time t2, t14, t26 and t38 on the basis of the distributive pulse CK1, and the read data D2, D5, D8 and D11 are outputted to the Q output in sequence as the data signals S2i.

Further, the register 4-8 reads data D3, D6 and D9 at time t6, t18 and t30 on the basis of the distributive pulse CK2, and the read data D3, D6 and D9 are outputted to the Q output in sequence as the data signals S3i.

These data signals S1i, S2i and S3i are given to the DA converters 5-1, 5-2 and 5-3, respectively, and then converted into the signals V01, V02 and V03, respectively as analog control data. In this case, since the data signals S1i, S2i and S3i are given to the DA converters 5-1, 5-2 and 5-3, respectively, a predetermined time is required to decide the signals V01, V02 and V03, respectively. These times are referred to as settling times Ts, which are shown by oblique lines in (J), (K) and (L) in FIG. 10, respectively.

As a result, the signal V01 is decided as levels Vtd1, Vtd4, Vtd7 and Vtd10 at time t1, t13, t25 and t37, respectively.

On the other hand, the signal V02 is decided as levels Vtd2, Vtd5 and Vtd8 at time t5, t17 and t29, respectively.

Further, the signal V03 is decided as levels Vtd3, Vtd6 and Vtd9 at time t9, t21 and t33, respectively.

As described above, when the levels of the signals V01, V02 and V03 have been decided, the respective delay rates of the delay circuits 6-1, 6-2 and 6-3 are decided. In correspondence thereto, the distributive pulses CK1, CK2 and CK3 are given from the pulse distributing circuit 2 to the delay circuits 6-1, 6-2 and 6-3, respectively. The distributive pulses CK1, CK2 and CK3 are delayed by delay times corresponding to the signals V01, V02 and V03, and then the delayed distributive pulses are outputted as the delay pulses CK1X, CK2X and CK3X, respectively.

For instance, the distributive pulses CK1 corresponding to the input pulses CLK "1", "4" and "7" are delayed by the delay circuit 6-1 according to the levels Vtd1, Vdt4 and Vdt7 of the signal V01, respectively. As a result, the pulses "1", "4" and "7" which rise at time t14, t18 and t27, respectively can be outputted as the delayed pulse CK1X.

On the other hand, the distributive pulses CK2 corresponding to the input pulses CLK "2", "5" and "8" are delayed by the delay circuit 6-2 according to the levels Vtd2, Vdt5 and Vdt8 of the signal V02, respectively. As a result, the pulses "2", "5" and "8" which rise at time t7, t21 and t35 can be outputted as the delayed pulse CK2X.

Further, the distributive pulses CK3 corresponding to the input pulses CLK "3", "6" and "9" are delayed by the delay circuit 6-3 according to the levels Vtd3, Vdt6 and Vdt9 of the signal V03, respectively. As a result, the pulses "3", "6" and "9" which rise at time t14, t23 and t38 can be outputted as the delay pulse CK3X.

As described above, the pulses "1", "2", "3", . . . of the input pulse CLK allow the register 1 to read addresses A3, A4, A5, . . . at the respective rise edge timings. These read addresses A3, A4, A5, . . . are converted into data D3, D4, D5, . . . through the memory device 3, respectively. Here, these data D3, D4, D5, . . . are outputted being delayed by the memory access time TAA after the addresses A3, A4, A5, . . . have been inputted.

Further, these data D3, D4, D5, . . . are read by the registers 4-3, 4-1 and 4-2 in sequence on the basis of "3" and "4" of the distributive pulses CK2, CK3, CK1, respectively. As a result, the data D3, D4, D5, . . . are outputted from the registers 4-3, 4-1 and 4-2.

These data D3, D4, D5, . . . are given to the DA converters 5-3, 5-1 and 5-2. As a result, after the settling times Ts of the DA converters 5-3, 5-1 and 5-2 have been elapsed, respectively, the levels Vdt3, Vtd4, Vtd5, . . . are decided as the signal V03, V01 and V02.

These levels Vtd3, Vtd4 and Vtd5, ... correspond to the data D3, D4, D5 ... respectively. As a result, the delay times of the pulses "3", "4" and "5" of the input pulse CLK can be controlled in real time according to the data D3, D4, D5, ... in correspondence to the addresses A3, A4, A5, ....

In other words, the register 1, 4-1, 4-2 and 4-3 operate as a pipe-line register.

On the basis of the above-mentioned operation, it is possible to realize the high-speed on-the-fly operation; that is, real time timing control as a synchronous circuit.

Further, in the above-mentioned embodiment, various construction such as DRAM, ROM, etc. can be adopted as the memory device 3. For instance, the memory device 3 can be constructed by a register file obtained by integrating level-sensitive or edge-sensitive D-latches. Further, the memory device 3 can be constructed by use of a static RAM obtained by integrating memory cells including a positive feedback loop.

FIGS. 1A and 1B show different embodiments, respectively, where data outputted from the memory device 3 are given into the registers 4-i on the basis of distributed pulses two and three periods before the certain destributed pulses. In general, data outputted from the memory device 3 are given into the registers 4-i on the basis of distributed pulses n periods before.

Figure 2:
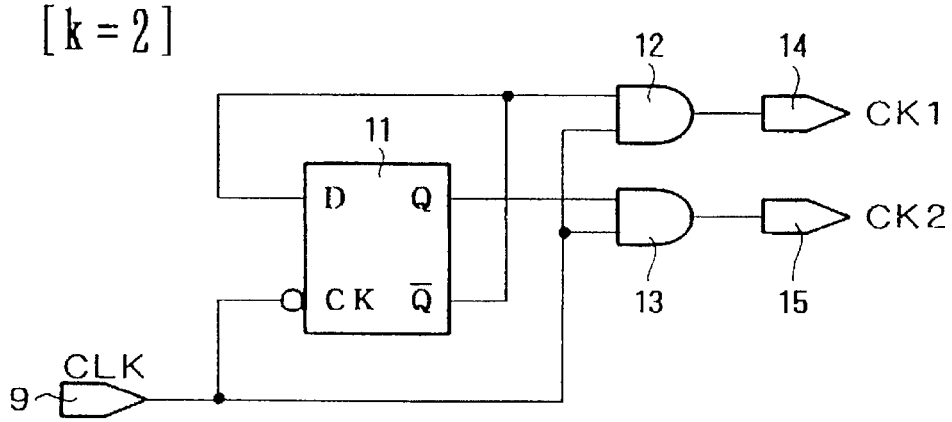
FIG. 2 is a circuit diagram showing a first example of the pulse distributing circuit shown in FIG. 1.

FIG. 2 shows a first example of the pulse distributing circuit 2 when k="2" in FIG. 1. As shown, the input pulse CLK inputted through the clock input terminal 9 is given to a CK input of a flip-flop 11 and two AND gates 12 and 13. A Q output of the flip-flop 11 is given to the AND gate 13; a /Q output of the flip-flop 11 is given to the AND gate 12 and a D input of the flip-flop 11. Two outputs of the AND gates 12 and 13 are outputted through two clock output terminals 14 and 15 as clocks CK1 and CK2, respectively.

In the construction as described above, in response to the fall edge of the input pulse CLK, the flip-flop 11 inverts the level of the Q output and further the level of the /Q output. As a result, whenever the input pulse CLK falls, the AND gates 12 and 13 pass the input pulse CLK alternately, so that the distributive pulse CK1 can be outputted through the clock output terminal 14, and the distributive pulse CK2 can be outputted through the clock output terminal 15.

Figure 3:
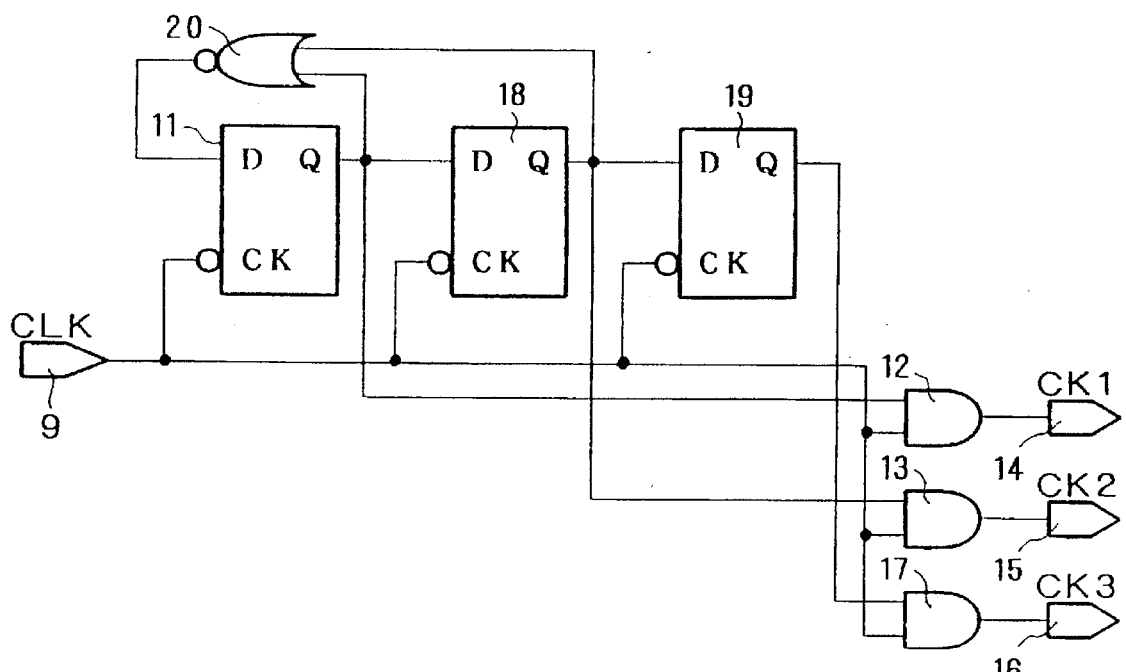
FIG. 3 is a circuit diagram showing a second example of the pulse distributing circuit shown in FIG. 1.

FIG. 3 shows a second example 2 the pulse distributing circuit 2 when k="3" in FIG. 1. As shown, the input pulse CLK inputted through the clock input terminal 9 is given to three CK inputs of three flip-flops 11, 18 and 19 and three AND gates 12, 13 and 17. A Q output of the flip-flop 11 is given to a D input of the flip-flop 18; a Q output of the flip-flop 18 is given to an D input of the flip-flop 19. Further, two Q outputs of the flip-flops 11 and 18 are given to a NOR gate 20, and an output of the NOR gate 20 is inputted to a D input of the flip-flop 11. The respective Q outputs of the flip-flops 11, 18 and 19 are given to the AND gates 12, 13 and 17, respectively. The outputs of the AND gates 12, 13 and 17 are outputted through three clock output terminals 14, 15 and 16, respectively.

In the construction as described above, in response to the fall edge of the input pulse CLK, the flip-flops 11, 18 and 19 change the levels of the Q outputs thereof according to the respective levels of the D inputs thereof. Further, in the initial state, for instance, the flip-flops 11, 18 and 19 are assumed to be all reset, and the respective Q outputs thereof are assumed to be "0".

Under these conditions, since the NOR gate 20 outputs "1", the flip-flop 11 sets the Q output thereof to "1" in synchronism with the fall edge of the succeeding input pulse CLK. At this time, although the Q output of the flip-flop 18 is at "0", the NOR gate 20 outputs "0" on the basis of the output "1" of the flip-flop 11.

Accordingly, in the succeeding input pulse CLK, the flip-flop 18 (to the D input of which the output of the flip-flop 11 is inputted) outputs "1" from the Q output. On the other hand, the flip-flop 11 (to the D input of which the output "0" of the NOR gate 20 is inputted) outputs "0" from the Q output. At this time, although the output of the flip-flop 11 is at "0", the output of the NOR gate 20 is kept at "0" by the output "1" of the flip-flop 18.

Further, in response to the succeeding input pulse CLK, the flip-flop 11 (to the D input of which the output "0" of the NOR gate 20 is inputted) keeps "0" at the Q output, and the flip-flop 18 (to the D input of which the output "0" of the flip-flop 11 is inputted) changes the Q output to "0", and the flip-flop 19 (to the D input of which the output "1" of the flip-flop 18 is inputted) changes the Q output to "1". That is, since the respective Q outputs of the flip-flops 11 and 18 change to "0", the output of the NOR gate 20 is inverted to "1".

After that, when the input pulse CLK falls, the flip-flop 11 (to the D input of which the output "1" of the NOR gate 20 is inputted) outputs the Q output "1" and the flip-flop 19 (to the D input of which the output "0" of the flip-flop 13 is inputted) outputs the Q output "0".

In other words, whenever the input pulse CLK falls, the Q outputs of the flip-flops 11, 18 and 19 output the Q output of "1" cyclically in this sequence, so that these three flip-flops 11, 18 and 19 are of three-stage register for circulating "1".

As a result, the three AND gates 12, 13 and 17 (to which the Q outputs of the flip-flops 11, 18 and 19 are given) pass the "1" level input pulses CLK when the Q outputs of the respective flip-flops are at "1". Accordingly, the input pulse CLK is distributed cyclically being passed through the AND gates 12, 13 and 14 for each input pulse CLK, and then outputted through the clock output terminals 14, 15 and 16 as the distributive pulses CK1 CK2 and CK3.

Figure 4:
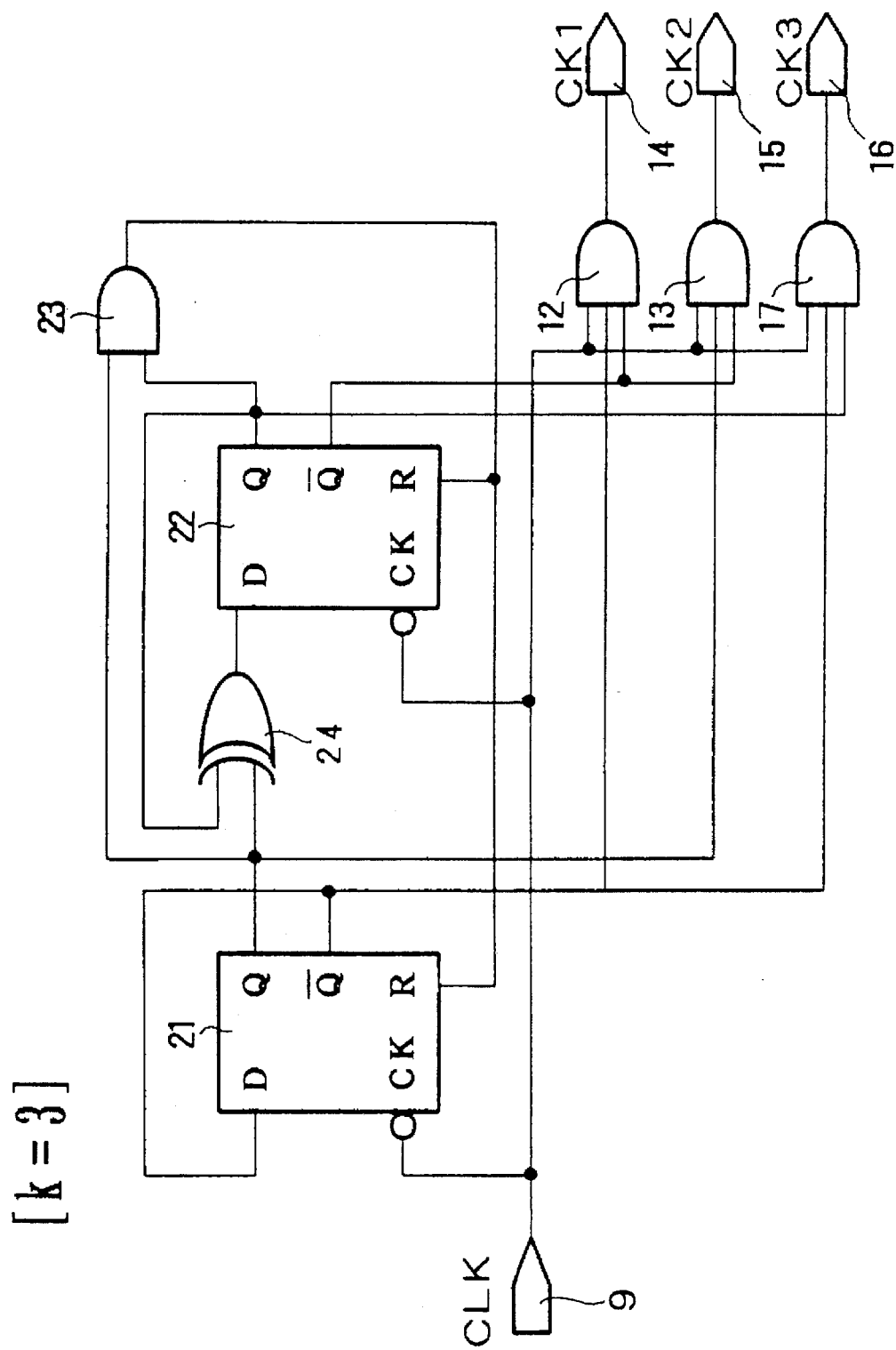
FIG. 4 a circuit diagram showing a third example of the pulse distributing circuit shown in FIG. 1.

FIG. 4 shows a third example of the pulse distributing circuit 2 when k="3" in FIG. 1. As shown, the input pulse CLK inputted through the clock input terminal 9 is given to two CK inputs of two flip-flops 21 and 22 each having a direct-reset input R, respectively. In the flip-flop 21, an /Q output thereof is inputted to a D input thereof. Further, a Q output of the flip-flop 21 is given to an AND gate 23 and an exclusive OR gate 24. The output of the exclusive OR gate 24 is given to a D input of the flip-flop 22. A Q output of the flip-flop 22 is given to the AND gate 23 and the exclusive OR gate 24. An output of the AND gate 23 is connected to an reset input R of each of the two flip-flops 21 and 22. Further, the respective /Q outputs of the flip-flops 21 and 22 are given to the AND gate 12 in addition to the input pulse CLK. Further, the Q output of the flip-flop 21 and the /Q output of the flip-flop 22 are given to the AND gate 13 in addition to the input pulse CLK. Further, the /Q output of the flip-flop 21 and the Q output of the flip-flop 22 are given to the AND gate 17 in addition to the input pulse CLK.

In the construction as described above, whenever the input pulse CLK falls, the flip-flops 21 and 22 change the level of the Q output according to the level of the D input thereof, respectively. For instance, in the initial state, the flip-flops 21 and 22 are both reset, and the Q outputs thereof are assumed to be at "0". At this time, the outputs of the AND gate 23 and the exclusive OR gate 24 are both "0".

Further, in the flip-flop 21, singe the /Q output thereof is connected to the D input, whenever the input pulse CLK falls, the level thereof is inverted.

On the other hand, in the exclusive OR gate 24, only when any one of the Q outputs of the flip-flops 21 and 22 is at "1", the output of the exclusive OR gate 24 outputs "1". Therefore, when the Q output of the flip-flop 22 is at "0" and further the Q output of the flip-flop 21 is at "1", the output of the exclusive OR gate 24 outputs first "1". Therefore, the flip-flop 22 (to the D input of which the "1" output is inputted) inverts the output "1" in synchronism with the fall edge of the input pulse CLK and outputs the Q output "1".

Further, when the respective Q outputs of the flip-flops 21 and 22 are at "1", the exclusive OR gate 24 outputs "0".

In other words, as far as a reset signal is inputted, the flip-flops 21 and 22 operate as a binary counter.

As far as not reset, the binary counter repeats the following conditions cyclically: both the outputs of the flip-flops 21 and 22 are "0"; the output of the flip-flop 21 is "1" and the output of the flip-flop 22 is "0"; and the output of the flip-flop 21 is "0" and the output of the flip-flop 22 is "1"; and both the outputs of the flip-flops 21 and 22 are "1".

However, when the Q outputs of both the flip-flops 21 and 22 change to "1", since the output of the AND gate 23 changes to "1", the flip-flops 21 and 22 (to each reset input R of which the output of the AND gate 23 is inputted) are reset forcibly, so the respective Q outputs thereof are set to "0", respectively to the initial state.

In other words, this circuit repeats the following conditions cyclically: both the outputs of the flip-flops 21 and 22 are "0"; the output of the flip-flop 21 is "1" and the output of the flip-flop 22 is "0"; and the output of the flip-flop 21 is "0" and the output of the flip-flop 22 is "1"; that is, "0", "1" and "2" are repeated as binary values.

As a result, the input pulse CLK is passed cyclically in the sequence of the AND gate 12 corresponding to the binary value "0"; the AND gate 13 corresponding to the binary value "1"; and the AND gate 17 corresponding to the binary value "2", so that it is possible to output the distributive pulses CK1, CK2 and CK3 of the input pulse CLK through the clock output terminals 14, 15 and 16, respectively.

Figure 5:
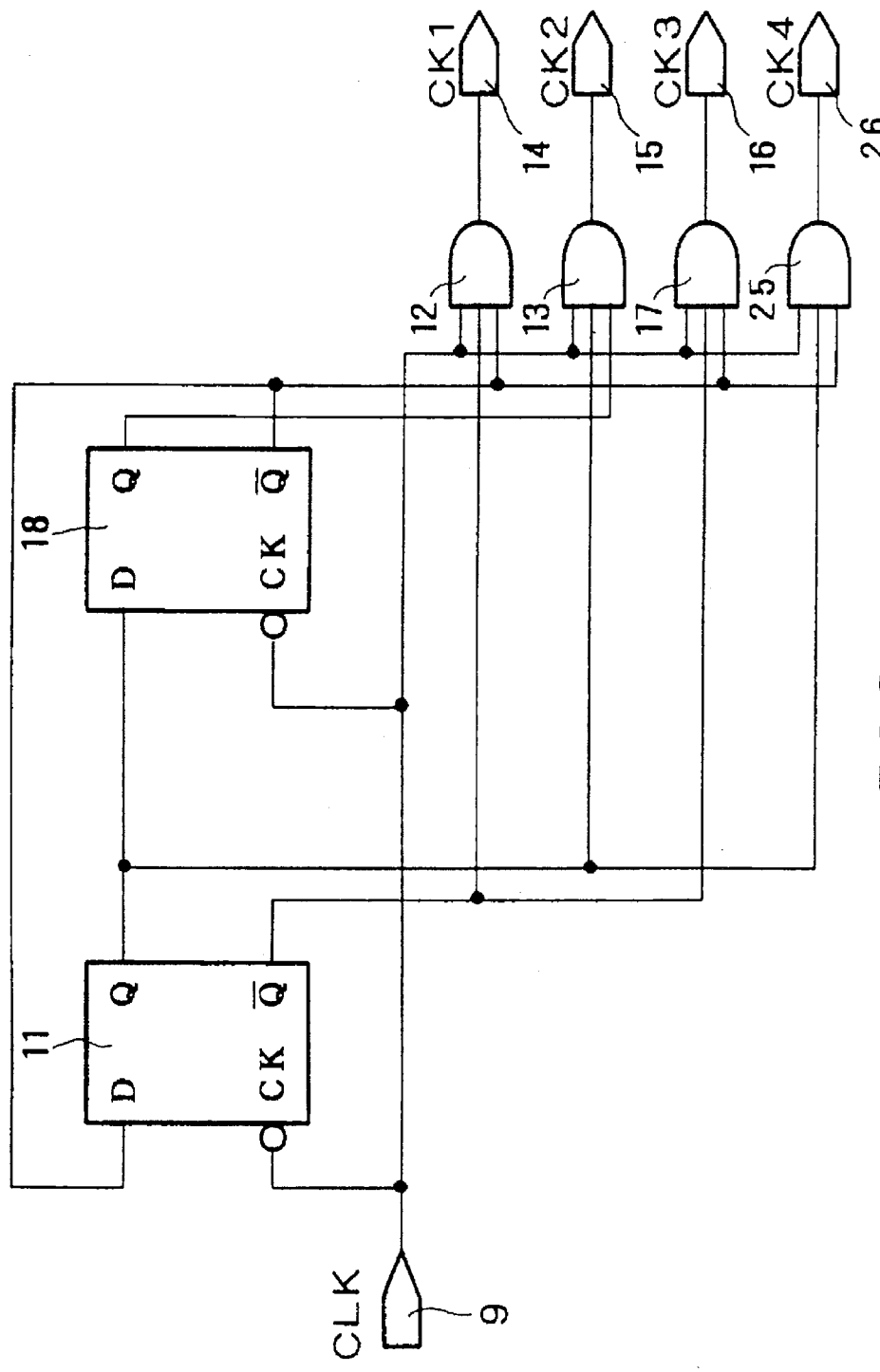
FIG. 5 is a circuit diagram showing a fourth example of the pulse distributing circuit shown in FIG. 1.

FIG. 5 shows a fifth example of the pulse distributing circuit 2 when k="4" in FIG. 1. As shown, the input pulse CLK inputted through the clock input terminal 9 is given to two CK inputs of the two flip-flops 11 and 18, respectively. On the other hand, a Q output of the flip-flop 11 is given to a D input of the flip-flop 18, and a /Q output of the flip-flop 18 is given to a D input of the flip-flop 11, respectively. Further, the /Q outputs of the flip-flops 11 and 18 and the input pulse CLK are given to an AND gate 12; the Q outputs of the flip-flops 11 and 18 and the input pulse CLK are given to an AND gate 13; the /Q outputs of the flip-flops 11 and 18 and the input pulse CLK are given to an AND gate 17; and the Q output of the flip-flop 11 and the /Q output of the flip-flop 18 and the input pulse CLK are given to an AND gate 25. The respective outputs of the AND gates 12, 13, 17 and 25 are outputted through clock output terminals 14, 15, 16 and 26.

In the construction as described above, the two flip-flops 11 and 18 construct a Jonson counter composed of shift registers operated in synchronism with the input pulse CLK. Since the /Q output of the flip-flop 18 is inputted to the D input of the flip-flop 11, this circuit is provided with a function for shifting "0" and "1" alternately as data. In other words, this circuit repeats cyclically the following statues in synchronism with the fall edge of the input pulse CLK: both the Q outputs of the flip-flops 11 and 18 are "0"; the Q output of the flip-flop 11 is "1" and the Q output of the flip-flop 18 is "0"; both the Q outputs of the flip-flops 11 and 18 are "1"; the Q output of the flip-flop 11 is "0" and the Q output of the flip-flop 18 is "1".

As a result, the input pulse CLK is passed cyclically in sequence through the AND gates 12, 13, 17 and 25 whenever the input pulse CLK falls, so that it is possible to output the distributive pulses CK1, CK2, CK3 and CK4 of the input pulse CLK through the clock output terminals 14, 15, 16 and 26, respectively.

Figure 6:
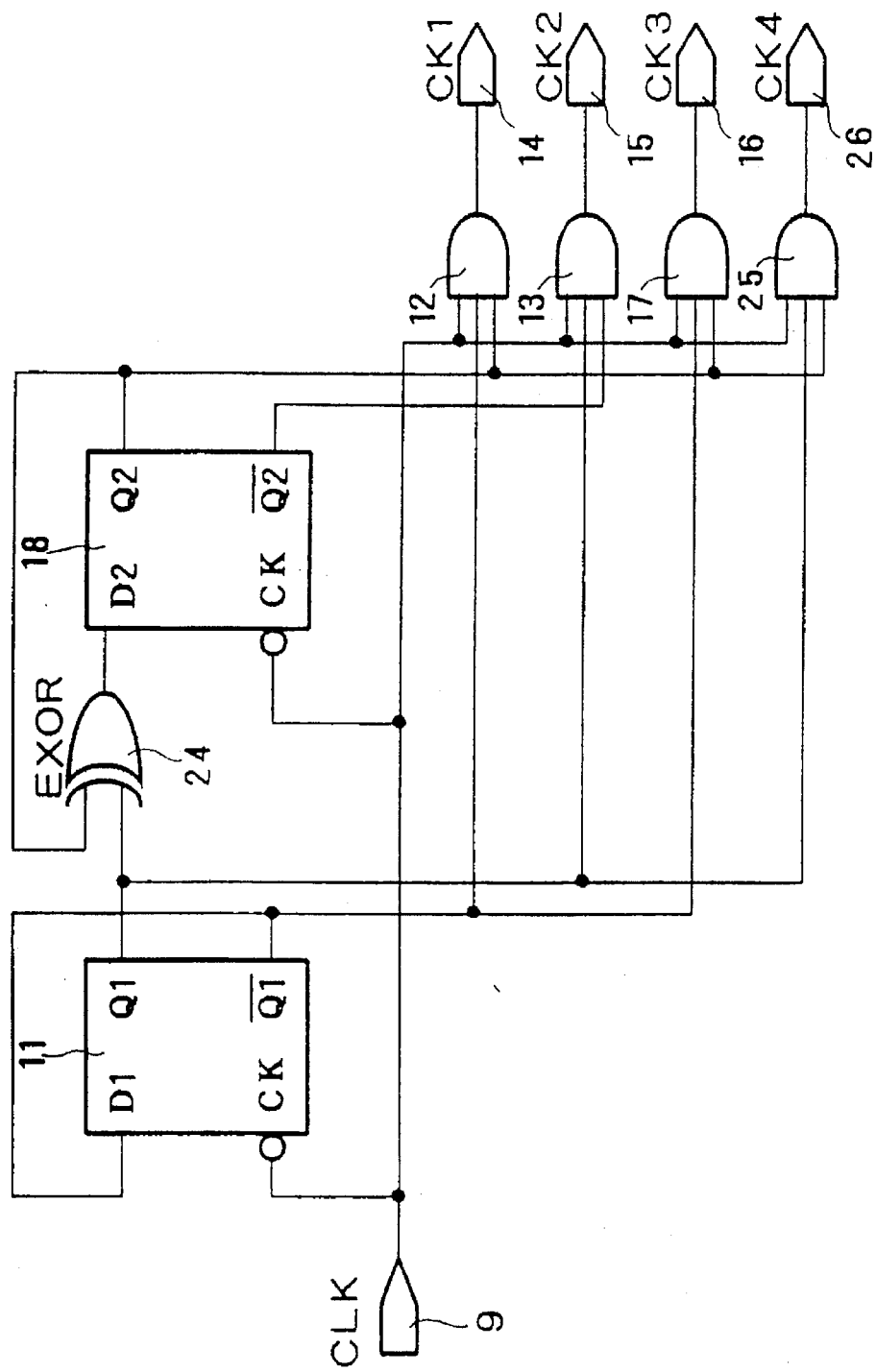
FIG. 6 is a circuit diagram showing a fifth example of the pulse distributing circuit shown in FIG. 1.

FIG. 6 shows a fifth example 5 of the pulse distributing circuit 2 when k="4" in FIG. 1. As shown, the input pulse CLK inputted through the clock input terminal 9 is given to two CK inputs of two flip-flops 11 and 18. In the flip-flop 11, a /Q1 output thereof is inputted to a D1 input thereof. Further, a Q1 output of the flip-flop 11 is given to an exclusive OR gate 24. The output of the exclusive OR gate 24 is given to a D2 input of the flip-flop 18. A Q2 output of the flip-flop 18 is given to the exclusive OR gate 24.

Further, the /Q1 output of the flip-flop 11 and the Q2 output of the flip-flop 18 are given to an AND gate 12 in addition to the input pulse CLK; the Q1 output of the flip-flop 11 and the /Q2 output of the flip flop 18 are given to an AND gate 13 in addition to the input pulse CLK; the /Q1 output of the flip-flop 11 and the Q2 output of the flip flop 18 are given to an AND gate 17 in addition to the input pulse CLK; and the Q1 and Q2 outputs of the flip-flops 11 and 18 are given to an AND gate 25 in addition to the input pulse CLK.

In the construction as described above, whenever the input pulse CLK falls, the flip-flops 11 and 18 change the level of the Q output according to the level of the D input thereof, respectively. For instance, in the initial state, the flip-flops 11 and 18 are both reset, and the Q outputs thereof are assumed to be at "0". At this time, the outputs of the exclusive OR gate 24 is "0".

Further, in the flip-flop 11, singe the /Q1 output thereof is connected to the Da input, whenever the input pulse CLK falls, the level thereof is inverted.

On the other hand, in the exclusive OR gate 24, only when any one of the Q outputs of the flip-flops 11 and 18 is at "1", the output of the exclusive OR gate 24 outputs "1". Therefore, when the Q2 output of the flip-flop 18 is at "0" and further the Q1 output of the flip-flop 11 is at "1", the output of the exclusive OR gate 24 first outputs "1". Therefore, the flip-flop 18 (to the D2 input of which the "1" output is inputted) inverts the output "1" in synchronism with the fall edge of the input pulse CLK and outputs the Q output "1".

Further, when the respective Q outputs of the flip-flops 11 and 18 are at "1", the exclusive OR gate 24 outputs "0".

In other words, the flip-flops 11 and 18 operate as a binary counter.

Further, the binary counter repeats the following conditions cyclically: both the outputs of the flip-flops 11 and 18 are "0"; the output of the flip-flop 11 is "1" and the output of the flip-flop 18 is "0"; the output of the flip-flop 11 is "0" and the output of the flip-flop 18 is "1"; and both the outputs of the flip-flops 11 and 18 are "1".

In other words, "0", "1" and "2" are repeated as binary values.

As a result, the input pulse CLK is passed cyclically in the sequence of the AND gate 12 corresponding to the binary value "0"; the AND gate 13 corresponding to the binary value "1"; the AND gate 17 corresponding to the binary value "2"; and the AND gate 25 corresponding to the binary value "3", so that it is possible to output the distributive pulses CK1, CK2, CK3 and CK4 of the input pulse CLK through the clock output terminals 14, 15, 16 and 26, respectively.

As described above, in FIG. 1, when the pulse distributing circuit 2 is constructed by an n-bit Jonson counter, it is possible to realize the pulse distribution of k=2n. Further, when the pulse distributing circuit 2 is constructed by n-bit binary counter, it is possible to realize the pulse distribution of k=$2^n$. In other words, it is possible to easily construct the pulse distributing circuit 2 of any desired number of k by use of the shift register constructions or the counter constructions.

FIG. 7 shows a first example of the delay circuits 6-1 to 6-k shown in FIG. 1. In the drawing, the distributive pulses CK1 to CKk inputted through an input terminal 27 are given to an input I of a ramp generator 29. An output Q of the ramp generator 29 is given to an inversion input AN of a comparator 30. On the other hand, control signals V01 to V0k obtained by the DA converters 5-1 to 5-k are inputted to a non-inversion input A of the comparator 30 through a DA converter output introducing terminal 28. Further, an output Q of the comparator 30 is inputted to an input I of the ramp generator 31. An output Q of the ramp generator 31 is given to an inversion input AN of a comparator 32. On the other hand, the control signals V01 to V0k obtained by the DA converters 5-1 to 5-k are inputted to a non-inversion input A of the comparator 32 through the DA converter output introducing terminal 28. The output Q of the comparator 32 is outputted as the delay pulses CK1X to CKkX through a delay signal output terminal 33.

In the above-mentioned construction, the operation thereof will be described hereinbelow with reference to FIG. 8, in which (A) denotes the distributive pulses CK1 to CKk inputted to the ramp generator 29 through the input terminal 27; (B) denotes the output Q of the ramp generator 29 (i.e., the inversion input AN of the comparator 30) and the signals V01 to V0k inputted through the DA converter output introducing terminal 28); (C) denotes the output Q of the comparator 30, (i.e, an input I of the ramp generator 31); (D) denotes the output Q of the ramp generator 31 (i.e., the inversion input AN of the comparator 32) and the signals V01 to V0k inputted through the DA converter output introducing terminal 28); and (E) denotes the output Q of the comparator 32, (i.e, the delayed pulses CK1X to CKkX outputted through the delay signal output terminal 33).

The distributive pulses CK1 to CKk inputted through the input terminal 27 are converted into a ramp-shaped waveform sloping downward beginning from the fall-start point by the ramp generator 29, as shown in FIG. 8(B).

The ramp-shaped waveform is given to the inversion input AN of the comparator 30 and then compared with the signals V01 to V0k inputted through the DA converter output introducing terminal 28. As a comparison result, the comparator 30 outputs a negative pulse delayed only in the fall edge thereof, as shown in FIG. 8(C).

The negative pulse is converted into a ramp-shaped waveform sloping downward beginning from the fall-start point by the ramp generator 31, as shown in FIG. 8(D).

The ramp-shaped waveform is given to the inversion input AN of the comparator 32, and then compared with the signals V01 to V0k inputted through the DA converter output introducing terminal 28. As a comparison result, the comparator 32 outputs a pulse delayed only in the fall edge of the negative pulse (C), as shown in FIG. 8(E).

In other words, the fall edge of the distributive pulse CK1 to CKk is delayed by the ramp generator 29 and the comparator 30, and the rise edge of the distributive pulse CK1 to CKk is delayed by the ramp generator 31 and the comparator 32. Further, the delay rates thereof can be controlled freely on the basis of the non-inversion inputs A of the comparators 30 and 32 (i.e., the signals V01 to V0k inputted through the DA converter output introducing terminal 28).

In the construction as described above, the delay circuits 6-1 to 6-k delay the distributive pulses CK1 to CKk by any desired delay time on the basis of the signals V01 to V0k, and output the delayed pulses CK1X to CKkX through the delayed signal output terminal 33, respectively.

Further, in FIG. 7, the distributive pulses CK1 to CKk are delayed in analog manner. Without being limited thereto, however, it is also possible to construct the delay circuits for delaying the distributive pulses stepwise in digital manner.

In this digital delay circuits, it is possible to omit the DA converters 5-1 to 5-k, so that the data signals S1i to Ski of the registers 4-1 to 4-k are directly applied to the delay circuits 6-1 to 6-k.

Various digital delay circuits can be adopted as the above-mentioned delay circuits, for instance, such as the shift registers operative in response to the higher rank clock, selection of a plurality of circuits having different delay times determined by use of the gate delay times, combinations of bypasses of a plurality of different delay elements to obtain any desired delay time, etc.

Figure 9:
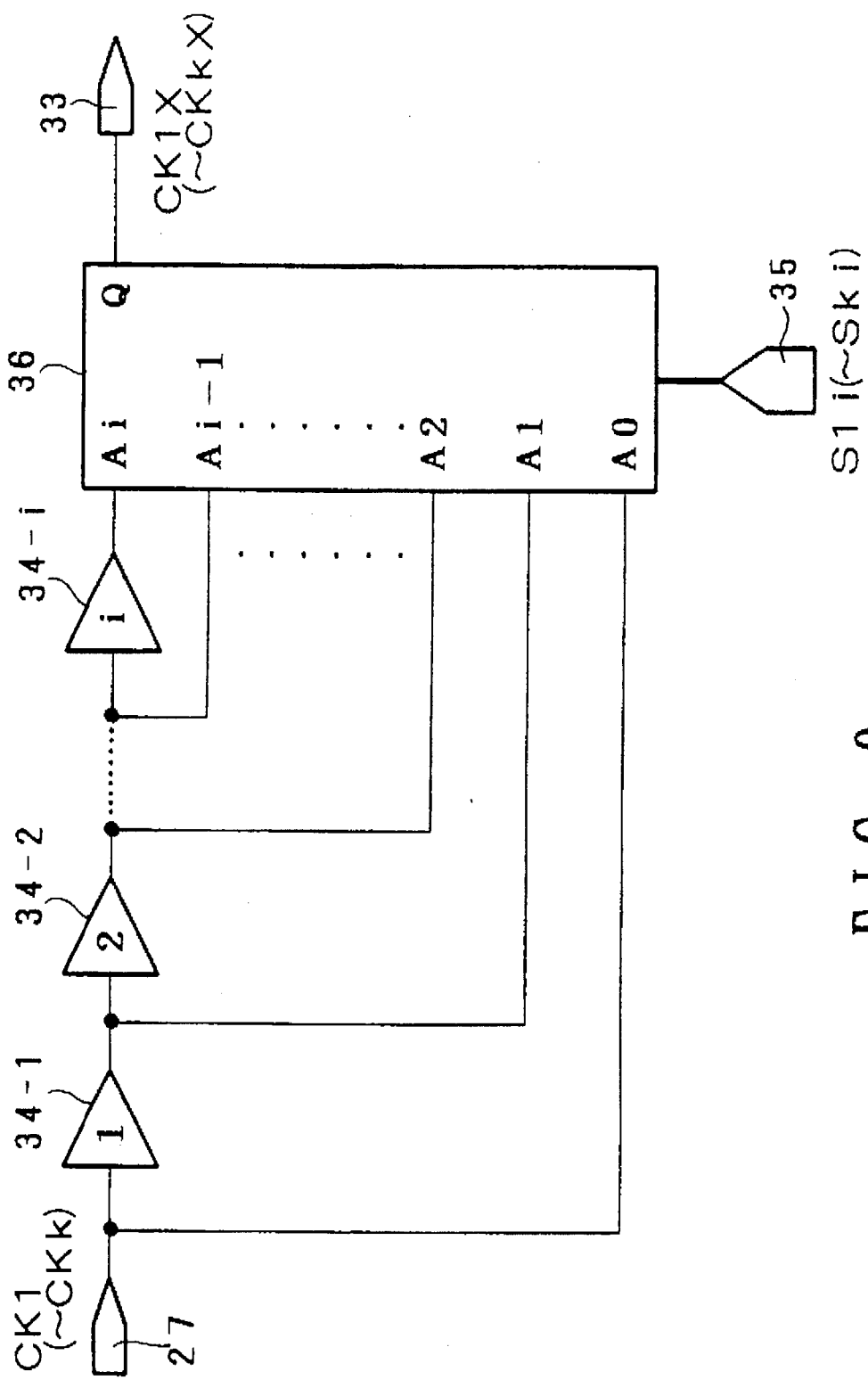
FIG. 9 is a circuit diagram showing a second example of the delay circuit shown in FIG. 1.

FIG. 9 shows a second example of the delay circuits 6-1 to 6-k shown in FIG. 1. In the drawing, the DA converters 5-1 to 5-k are omitted and further the delay circuits 6-1 to 6-k are so constructed as to be controlled in digital fashion. As shown, the distributive pulses CK1 to CKk inputted through the input terminal 27 are inputted to series-connected buffers 34-1 to 34-i. Further, the distributive pulses CK1 to CKk inputted through the input terminal 27 are inputted to an input A0 of a multiplexer 36. The respective outputs of the buffers 34-1 to 34-i are inputted to inputs A1 to Ai of the multiplexer 36, respectively. The multiplexer 36 is controlled on the basis of the data signals S1i to Ski applied through a control data input terminal 35 in such a way as to select and output one of the inputs A0 to Ai through an output Q. The output Q of the multiplexer 36 is transmitted as the delay pulses CK1X and CK2X through a delay signal output terminal 33. Further, the buffers 34-1 to 34-i have a constant delay time, respectively.

In the construction as described above, although being given to only the input A0 of the multiplexer 36 without any delay, since the distributive pulses CK1 to CKk inputted through the input terminal 27 are inputted to the input buffer A1 being delayed by a delay time of the buffer 34-1; to the input buffer A2 being delayed by a total of the delay times of the buffers 34-1 and 34-2; ... ; to the input buffer Ai being delayed by a total of the delay times of the buffers 34-1 and 34-i. In other words, the pulses delayed stepwise by delay times determined on the basis of the number of series-connected stages of the buffers 34-1 to 34-i are given to the inputs A0 to Ai of the multiplexer 36.

Further, the multiplexer 36 selects and outputs one of the pulses from the inputs A0 to Ai according to the data signals S1i to Ski inputted through the control data input terminal 35. In other words, since the pulses delayed according to the data signals S1i to Ski are selected, it is possible to obtain the distributive pulses CK1 to CKk delayed according to the data signals S1i to Ski.

In the construction as described above, the delay circuit 6-1 to 6-k delay the distributive pulses CK1 to CKk by delay times determined by any number of stages of the buffers 34-1 to 34-i on the basis of the data signals S1i to Ski, and outputs these delayed pulses CK1X to CKkX through the delay signal output terminal 33.

As described above, in the timing generating device according to the present invention, since the timing generating device is so constructed that the addresses for providing respective different delay times to the input pulses are applied on the basis of the input pulses, the timing can be generated as a synchronous circuit. Further, since a real timing control operative at the clock rate more than 200 MHz can be realized, the timing generating device according to the present invention can be easily incorporated with a large scale integrated circuit of synchronous digital system, thus providing such an effect as to facilitate the test thereof.

In the timing generating device according to the present invention, since the delay times of the delay means for delaying the clock pulses are controlled on the basis of the respective delay time data applied in synchronism with the clock signals, it is possible to generate the timings as a synchronous circuit.

What is claimed is:

1. A timing generating device, comprising:
   pulse distributing means for distributing a clock pulse signal to a plurality of routes in sequence and outputting the distributed pulses;
   first register means for reading address data in synchronism with the clock signal;
   storing means for reading output of said first register means as address data and outputting delay time data;
   a plurality of second register means for reading and storing the outputted data of said storing means individually on the basis of the distributed pulses;
   a plurality of delaying means for controllably delaying the distributed pulses individually on the basis of the output data of said second register means; and
   output means for outputting the delayed distributed pulses.

2. The timing generating device of claim 1, wherein said output means includes logic means for synthesizing the delayed pulses to form a series of pulse trains.

3. The timing generating device of claim 1, wherein said pulse distributing means includes a flip-flop for inverting a level of the clock signal in synchronism therewith; and a logic circuit for distributing the clock pulse signal to two routes on the basis of an output of said flip-flop.

4. The timing generating device of claim 1, wherein said pulse distributing means includes a shift register for shifting specific data in synchronism with the clock signal; and a logic circuit for distributing the clock pulse signal to a plurality of the routes on the basis of an output of said shift register.

5. The timing generating device of claim 1, wherein said pulse distributing means includes a counter reset to zero for each predetermined counts in synchronism with the clock signal; and a logic circuit for distributing the clock pulse signal to a plurality of the routes on the basis of an output of said counter.

6. The timing generating device of claim 1, wherein said pulse distributing means includes a shift register operative in synchronism with the clock signal so as to invert a final stage level thereof and further to loop-back the inverted level to a first stage thereof; and a logic circuit for distributing the clock pulse signal to a plurality of the routes on the basis of an output of each stage of said shift register.

7. The timing generating device of claim 1, wherein said pulse distributing means includes a counter operative cyclically for counting operation in synchronism with the clock signal; and a logic circuit for distributing the clock pulse signal to a plurality of the routes on the basis of an output of said counter.

8. The timing generating device of claim 1, wherein said pulse distributing means includes a plurality of flip-flops whose output level combinations change cyclically; and a logic circuit for logically decoding the output level combinations of said flip-flops, and selecting and further distributing the pulse signal to a plurality of routes on the basis of decoded results thereof.

9. The timing generating device of claim 1, wherein said storing means is constructed by a register file formed by integrating a plurality of level-sensitive or edge-sensitive D latch circuits.

10. The timing generating device of claim 1, wherein said storing means is constructed by a static RAM formed by integrating a plurality of memory cells including positive feedback loop.

11. The timing generating device of claim 2, wherein said storing means is constructed by a static RAM formed by integrating a plurality of memory cells including positive feedback loop.

12. The timing generating device of claim 1, wherein said delaying means includes a ramp waveform generating circuit for generating a ramp waveform being triggered in response to a rise edge or fall edge of a pulse; and a comparator circuit for comparing an output value of said ramp waveform generating circuit with an analog value corresponding to output data of said second register means.

13. The timing generating device of claim 1, wherein said delaying means is constructed by a circuit for delaying a pulse stepwise digitally on the basis of output data of said second register means.

14. The timing generating device of claim 2, wherein said delaying means is constructed by a circuit for delaying a pulse stepwise digitally on the basis of output data of said second register means.

15. The timing generating device of claim 1, wherein said delaying means includes a delay element group formed by connecting a plurality of delay elements in series, for delaying a pulse stepwise; and a multiplexer circuit for selecting and further outputting each output of each delaying element of said delay element group on the basis of output data of said second register means.

16. The timing generating device of claim 2, wherein said delaying means includes a delay element group formed by connecting a plurality of delay elements in series, for delaying a pulse stepwise; and a multiplexer circuit for selecting and further outputting each output of each delaying element of said delay element group on the basis of output data of said second register means.

17. The timing generating device of claim 13, wherein said delaying means includes a delay element group formed by connecting a plurality of delay elements in series, for delaying a pulse stepwise; and a multiplexer circuit for selecting and further outputting each output of each delaying element of said delay element group on the basis of output data of said second register means.

18. The timing generating device of claim 14, wherein said delaying means includes a delay element group formed by connecting a plurality of delay elements in series, for delaying a pulse stepwise; and a multiplexer circuit for selecting and further outputting each output of each delaying element of said delay element group on the basis of output data of said second register means.

19. A timing generating device, comprising:

pulse distributing means for distributing a clock pulse signal to a plurality of routes in sequence and outputting the distributed pulses;

a plurality of delaying means for receiving corresponding one of the distributed pulses, respectively and for delaying each of the received distributed pulses individually; and and delay time data applying means for reading each of delay time data in synchronism with the clock signal and for applying each read delay time data to corresponding one of a plurality of said delaying means.

20. The timing generating device of claim 19, which further comprises delay time data outputting means for outputting the delay time data, said delay time data outputting means including storing means for addressing and storing a plurality of delay time data so as to read external addresses in sequence in synchronism with the clock signal and to output the delay time data corresponding to the read address in sequence.

21. The timing generating device of claim 19, wherein when a certain distributed pulse is delayed, said delay time data applying means reads the delay time data in synchronism with a distributed pulse a predetermined number of periods before the certain distributed pulse, and applies the read delay time data to said delaying means before the certain distributed pulse is applied to said corresponding delaying means.

22. The timing generating device of claim 20, wherein when a certain distributed pulse is delayed, said delay time data applying means reads the delay time data in synchronism with a distributed pulse a predetermined number of periods before the certain distributed pulse, and applies the read delay time data to said delaying means before the certain distributed pulse is applied to said corresponding delaying means.

23. The timing generating device of claim 19, wherein said delay time data applying means is constructed so as to convert each delay time data into analog value and apply the converted analog value to each of said delaying means, each of said delaying means delaying each distributed pulse according to each delay time data applied thereto as the analog value, respectively.

24. The timing generating device of claim 20, wherein said delay time data applying means is constructed so as to convert each delay time data into analog value and apply the converted analog value to each of said delaying means, each of said delaying means delaying each distributed pulse according to each delay time data applied thereto as the analog value, respectively.

25. The timing generating device of claim 19, wherein said delay time data applying means is constructed so as to apply each of the delay time data as an analog value to each of said delaying means, each of said delaying means delaying each distributed pulse according to each delay time data applied thereto as the analog value, respectively.

26. The timing generating device of claim 20, wherein said delay time data applying means is constructed so as to apply each of the delay time data as an analog value to each of said delaying means, each of said delaying means delaying each distributed pulse according to each delay time data applied thereto as the analog value, respectively.

27. The timing generating device of claim 21, wherein said predetermined number is one.

28. The timing generating device of claim 21, wherein said predetermined number is two.

29. The timing generating device of claim 21, wherein said predetermined number is three.

30. The timing generating device of claim 22, wherein said predetermined number is one.

31. The timing generating device of claim 22, wherein said predetermined number is two.

32. The timing generating device of claim 22, wherein said predetermined number is three.

* * * * *